United States Patent

Shin et al.

[11] Patent Number: 5,843,850
[45] Date of Patent: Dec. 1, 1998

[54] METHOD OF STRIPPING A NITRIDE LAYER FROM A WAFER AND WET ETCHING APPARATUS USING THE SAME

[75] Inventors: Dong-Min Shin, Suwon; Seung-Ho Jun, Sungnam; Se-Jong Ko; Tae-Juon Kim, both of Suwon, all of Rep. of Korea

[73] Assignee: Samsung Electronics Co., Ltd., Suwon, Rep. of Korea

[21] Appl. No.: 735,503

[22] Filed: Oct. 23, 1996

[30] Foreign Application Priority Data

Oct. 25, 1995 [KR] Rep. of Korea .................. 1995-37146

[51] Int. Cl.$^6$ ....................................... C23F 1/00
[52] U.S. Cl. ...................... 438/757; 216/93; 156/135 L; 156/135 LC
[58] Field of Search ............................... 438/757; 216/93; 156/135 L, 135 LC

[56] References Cited

U.S. PATENT DOCUMENTS 4,559,098  12/1985  Dunn ....................................... 156/345
4,980,017  12/1990  Kaji et al. ................................ 216/93

*Primary Examiner*—Deborah Jones
*Attorney, Agent, or Firm*—Jones & Volentine, L.L.P

[57] ABSTRACT

A method of stripping a nitride layer from a wafer includes the steps of putting the wafer into a process bath containing a stripping solution, passing the stripping solution from the process bath through a filter to remove the nitride particles contained therein, heating the filtered stripping solution through an in-line electrical heater with two heating parts connected in parallel to allow the stripping solution to quickly return to the proper etching temperature, and returning the temperature recovered stripping solution to the process bath. The filtered stripping solution is branched through the parallel heating parts to enable it to be quickly heated. The stripping solution may be a phosphoric acid solution, whose proper etching temperature is about 163° C. The in-line heater consists of at least two heating parts connected in parallel, each with an electrical capacity of 6 KW.

6 Claims, 4 Drawing Sheets

METHOD OF STRIPPING A NITRIDE LAYER FROM A WAFER AND WET ETCHING APPARATUS USING THE SAME

FIELD OF THE INVENTION

The present invention relates to the fabrication of a semiconductor device, and more particularly to a method of stripping a nitride layer (a $Si_3N_4$ layer) formed on a wafer so as to form a patterned layer of nitride material on the wafer surface and an wet etching apparatus using the same.

BACKGROUND OF THE RELATED ART

Generally, in the fabrication of a semiconductor device, wet and dry etching processes are used. A dry etching process uses mixed gases as an etchant to remove a nitride layer formed over the whole surface of a wafer. A wet etching process uses a phosphoric acid solution ($H_3PO_4$) as an etchant to remove a nitride layer formed on a properly patterned layer on a wafer, particularly a patterned conducting layer.

The phosphoric acid solution, however, has chemically unstable characteristics which considerably reduces the etch rate of the nitride layer over time. Hence, additional time is required to complete the removing of the nitride layer by using this chemical solution.

Two factors govern the etch rate of the nitride layer that is removed by the phosphoric acid solution. One is the temperature recovery time and the other is the concentration change of the solution.

FIG. 1 illustrates the construction of a wet etching apparatus employing a conventional method of stripping a nitride layer from a wafer.

Referring to FIG. 1, a process bath 10 contains the phosphoric acid solution 12 for stripping the nitride layer from a wafer 14. The solution 12, which contains nitride particles generated during the etching process, is circulated from the process bath 10 through a filter 18 to an in-line heater 20 and back to the process bath 10 by means of a circulator pump 16. The filter 18 is located between the circulator pump 16 and the in-line heater 20 to remove the nitride particles from the solution. The in-line heater 20 then heats the filtered solution. The filtered and heated solution from the in-line heater 20 is then supplied again to the process bath 10. The heater 20 conventionally has an electrical capacity of 6 KW which maintains the temperature of the solution circulated by the circulator pump 16 at a level suitable for stripping the nitride layer, which is about 163° C.

Generally, when a wafer 14 is dipped into the process bath 10 having the phosphoric acid solution 12, the solution temperature decreases below the suitable level of about 163° C., as indicated by the dashed (6 KW) line in FIG. 3. In this case, 14 to 20 minutes are required to compensate for the temperature decrease by means of the in-line heater 20, which results in a long temperature recovery time of the solution. This in-turn increases the processing time required for stripping the nitride layer. Moreover, the etch rate of the nitride layer to the phosphorous acid solution is gradually decreased with time, as indicated by the dashed (6 KW) line in FIG. 4. Hence, a considerably long time is required for the wet etching apparatus employing the conventional stripping method of a nitride layer.

SUMMARY OF THE INVENTION

Thus, it is an object of the present invention to provide a method of stripping a nitride layer from a wafer surface by using a phosphoric acid solution, wherein the temperature recovery time of the solution is considerably reduced while maintaining the etch rate at a suitable level.

According to an embodiment of the present invention, there is provided a method of stripping a nitride layer from a semiconductor wafer using a wet etching apparatus comprising a process bath containing a stripping solution, a filter, an electrical in-line heater having at least two heating parts connected in parallel, and a circulator pump for circulating the stripping solution from the process bath through the filter to the in-line heater and back to the process bath, the method comprising the steps of: placing the wafer in a process bath containing a stripping solution; etching the nitride layer on the wafer with the stripping solution; filtering the stripping solution through the filter to remove nitride particles contained therein; heating the filtered stripping solution to a proper etching temperature by branching the filtered stripping solution through the at least two parallel, connected heating parts; and returning the stripping solution with the proper etching temperature back to the process bath.

In this embodiment, the stripping solution is phosphoric acid and the proper etching temperature is about 163° C.

According to another embodiment of the present invention there is provided a wet etching apparatus for stripping a nitride layer from a semiconductor wafer surface, the apparatus comprising: a process bath containing a stripping solution for etching the wafer; a filter for removing nitride particles contained in the stripping solution; an electrical in-line heater for heating the filtered stripping solution to a proper etching temperature, the in-line heater having at least two heating parts connected in parallel, each with an electrical capacity of 6 KW, whereby the filtered stripping solution is branched through the at least two parallel heating parts and quickly heated to the proper etching temperature; and a circulator pump for circulating the stripping solution from the process bath, through the filter, through the in-line heater and returning to the process bath.

In this embodiment, the stripping solution may be a phosphoric acid solution, whose proper etching temperature is about 163° C. Thus, for each embodiment there is provided means for decreasing the temperature recovery time of the stripping solution while maintaining the etch rate at a suitable level.

BRIEF DESCRIPTION OF THE DRAWINGS

This invention may be better understood and its object will become apparent to those skilled in the art by reference to the detailed description below together with the accompanying drawings in which.

DESCRIPTION OF PREFERRED EMBODIMENT

Figure 1:
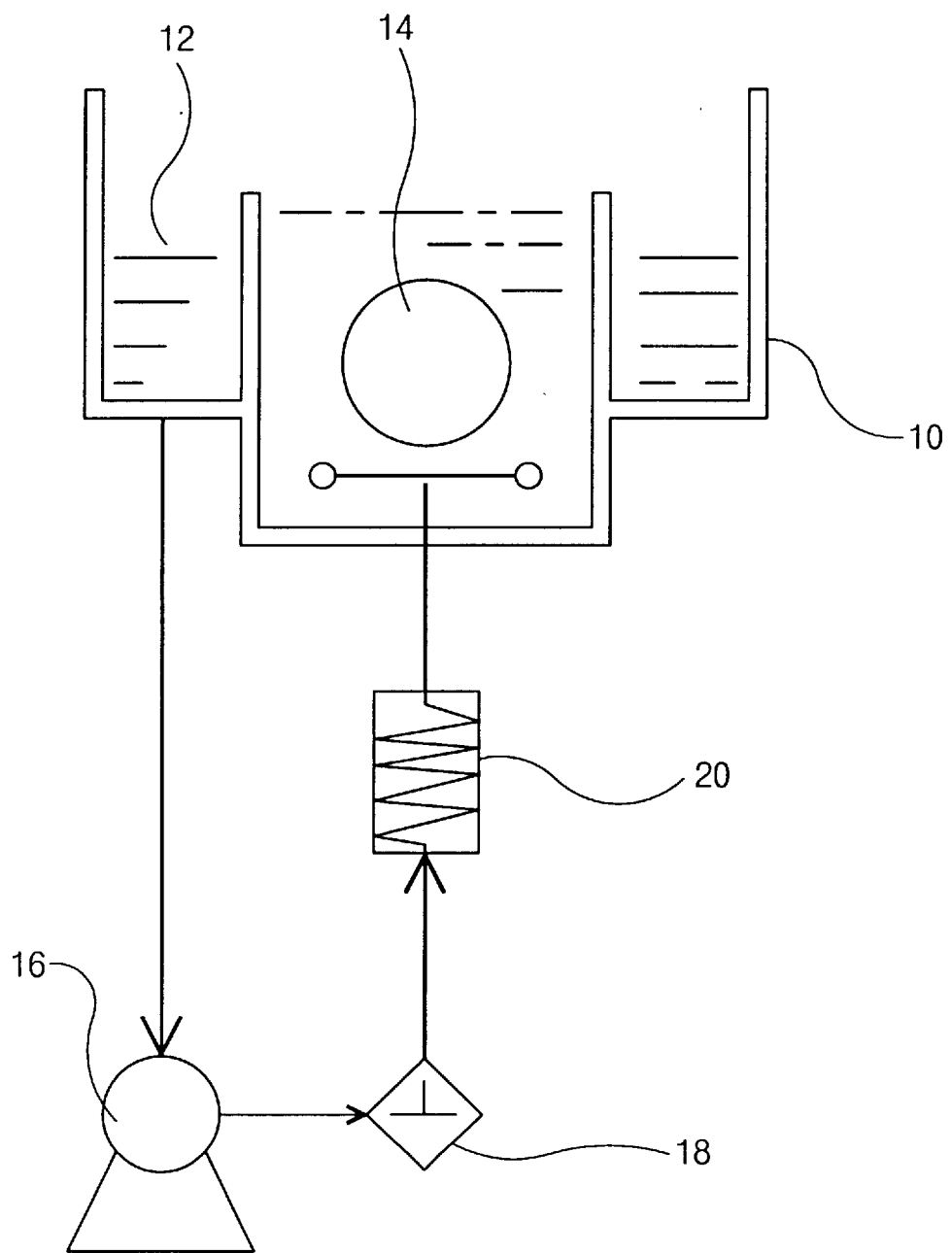
FIG. 1 is a schematic diagram for illustrating the construction of a wet etching apparatus employing a conventional method of stripping a nitride layer from a wafer.
Figure 2:
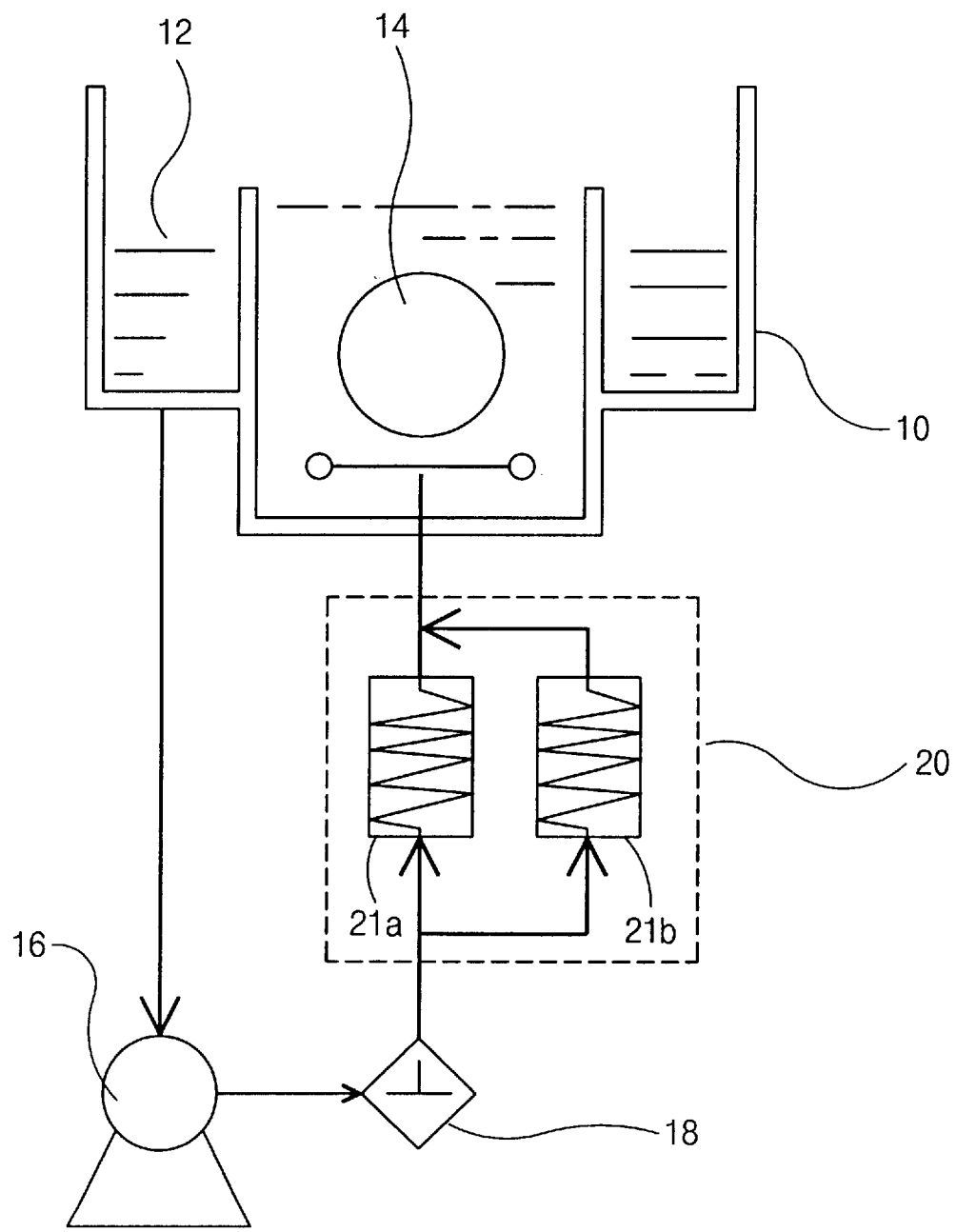
FIG. 2 is a schematic diagram for illustrating the construction of a novel wet etching apparatus employing the present inventive method of stripping a nitride layer from a wafer.

Referring to FIG. 2, the novel method of stripping a nitride layer from a wafer surface in accordance with the present invention will be described. In general, the method includes the steps of removing the nitride particles contained in a stripping solution circulated from an process bath 10, quickly heating the filtered stripping solution, and then providing the heated stripping solution back to the process bath 10. The wet etching apparatus of FIG. 2 is employed to carry out the inventive method.

The wet etching apparatus, as shown in FIG. 2, includes the process bath 10 containing the stripping solution 12 for removing the nitride layer on the wafer surface 14, a circulator pump 16 for circulating the stripping solution, a filter 18 for removing the nitride particles contained in the stripping solution supplied by circulator pump 16, and an electrical in-line heater 21 with an electrical capacity of 12 KW for heating the filtered stripping solution that is returned to the process bath 10. The in-line heater 21 consists of two heating parts 21a and 21b connected in parallel each with an electrical capacity of 6 KW, as shown in FIG. 2, so that the filtered stripping solution flows through the parallel paths of the heater, whereby it is quickly heated to the proper etching temperature. The stripping solution 12 is preferably a phosphoric acid solution, whose proper etching temperature is about 163° C.

In operation, when a wafer 14 with a nitride layer formed thereon is put into the process bath 10 containing the stripping solution 12, the stripping solution suffers a rapid temperature drop. The reduced-temperature stripping solution is circulated by means of the circulator pump 16. The stripping solution is filtered by the filter 18, and then quickly heated to the proper etching temperature through the parallel heating parts 21a and 21b. It is understood that while at least two parallel heating parts are used, more than two may be used in parallel within the scope of the present invention.

Figure 3:
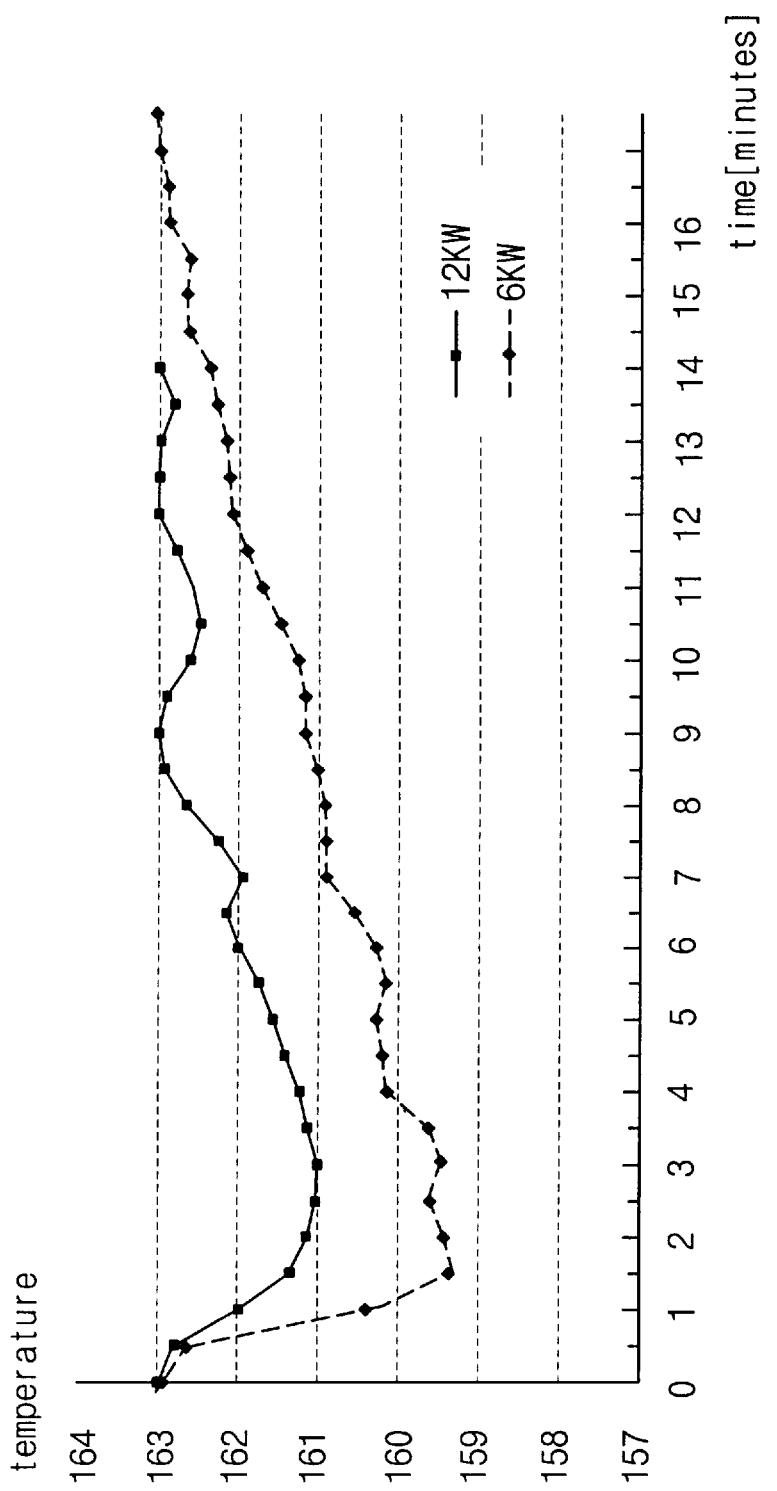
FIG. 3 is a graph for schematically illustrating the difference, between the conventional method and the present inventive method, in the temperature variation of a stripping or etching solution over time.
Figure 4:
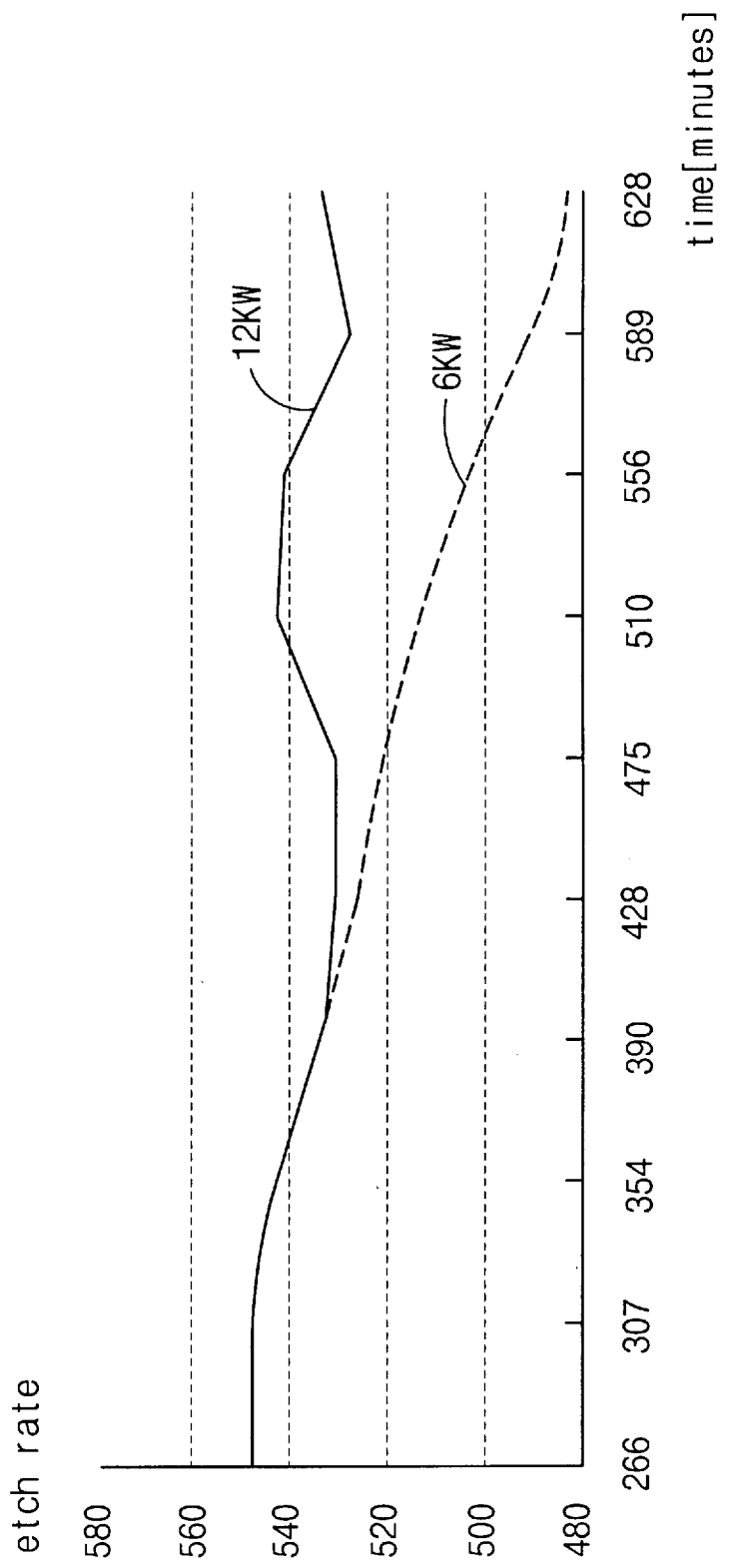
FIG. 4 is a graph for schematically illustrating the difference, between the conventional method and the present inventive method, in the variation of the etch rate of the nitride layer to the phosphoric acid over time.

Referring to FIG. 3, if a wafer 14 is dipped into the phosphoric acid solution 12 in the process bath 10, the solution suffers a temperature drop from the proper etching temperature of about 163° C. As shown by the solid (12 KW) line in FIG. 3, it takes about 8 minutes for the stripping solution to return to the proper etching temperature after passing through the heating parts 21a and 21b, thereby considerably reducing the time taken for the stripping of the nitride layer. Additionally, as indicated by the solid (12 KW) line in FIG. 4, the etch rate of the nitride to the phosphoric acid solution does not significantly vary over time, thereby maintaining the proper etch rate of about 530 to 550 Å.

While the present invention has been described with reference to a particular embodiment thereof, it is understood that various changes and modifications may be effected therein without departing from the spirit and scope of the invention as defined in the appended claims.

What is claimed is:

1. A method of stripping a nitride layer from a semiconductor wafer using a wet etching apparatus comprising a process bath containing a stripping solution, a filter, an electrical in-line heater having at least two heating parts connected in parallel, and a circulating pump for circulating said stripping solution from said process bath through said filter to said in-line heater and back to said process bath, said method comprising the steps of:

placing said wafer in a process bath containing a stripping solution;

etching said nitride layer on said wafer with said stripping solution;

filtering said stripping solution through said filter to remove nitride particles contained in said stripping solution, to produce a filtered stripping solution;

heating said filtered stripping solution to a temperature sufficient to etch said nitride layer by branching said filtered stripping solution through said at least two parallel, connected heating parts to produce a heated stripping solution; and returning said heated stripping solution to said process bath.

2. The method as claimed in either claim 1, wherein said stripping solution comprises phosphoric acid.

3. The method of claim 2, wherein said temperature is about 163° C.

4. A wet etching apparatus for stripping a nitride layer from a semiconductor wafer surface, said apparatus comprising:

a process bath containing a stripping solution for etching said wafer;

a filter for removing nitride particles contained in said stripping solution;

an electrical in-line heater for heating the filtered stripping solution to the proper etching temperature, said in-line heater having at least two heating parts connected in parallel, each with an electrical capacity of 6 KW, whereby said filtered stripping solution is branched through at least two parallel heating parts and quickly heated to said proper etching temperature.

5. An apparatus as defined in claim 4, wherein said stripping solution is phosphoric acid.

6. An apparatus as defined in claim 5, wherein the proper etching temperature is about 163° C.

\* \* \* \* \*